US008921222B2

(12) United States Patent
Kuo et al.

(10) Patent No.: US 8,921,222 B2
(45) Date of Patent: Dec. 30, 2014

(54) PILLAR STRUCTURE HAVING A NON-PLANAR SURFACE FOR SEMICONDUCTOR DEVICES

(71) Applicant: Taiwan Semiconductor Manufacturing Company, Ltd., Hsin-Chu (TW)

(72) Inventors: Tin-Hao Kuo, Hsin-Chu (TW); Chen-Shien Chen, Zhubei (TW); Ching-Wen Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/311,794

(22) Filed: Jun. 23, 2014

(65) Prior Publication Data
US 2014/0302669 A1    Oct. 9, 2014

Related U.S. Application Data

(60) Continuation of application No. 13/933,940, filed on Jul. 2, 2013, now Pat. No. 8,803,319, which is a continuation of application No. 13/663,203, filed on Oct. 29, 2012, now Pat. No. 8,546,945, which is a division of application No. 12/704,183, filed on Feb. 11, 2010, now Pat. No. 8,318,596.

(51) Int. Cl.
*H01L 21/44* (2006.01)
*H01L 23/00* (2006.01)

(52) U.S. Cl.
CPC .................................... *H01L 24/11* (2013.01)
USPC ................... 438/613; 257/737; 257/E21.295; 257/E23.07

(58) Field of Classification Search
USPC .............. 257/737, E21.295, E23.07; 438/613
See application file for complete search history.

(56) References Cited

U.S. PATENT DOCUMENTS

| | | | |
|---|---|---|---|
| 4,811,082 | A | 3/1989 | Jacobs et al. |
| 4,990,462 | A | 2/1991 | Sliwa |
| 5,075,253 | A | 12/1991 | Sliwa |
| 5,380,681 | A | 1/1995 | Hsu |
| 5,466,635 | A | 11/1995 | Lynch et al. |
| 5,481,133 | A | 1/1996 | Hsu |
| 5,736,456 | A | 4/1998 | Akram |
| 5,759,910 | A | 6/1998 | Mangold et al. |
| 6,002,177 | A | 12/1999 | Gaynes et al. |
| 6,107,164 | A | 8/2000 | Ohuchi |
| 6,107,180 | A | 8/2000 | Munroe et al. |
| 6,175,161 | B1 | 1/2001 | Goetz et al. |
| 6,187,678 | B1 | 2/2001 | Gaynes et al. |
| 6,229,216 | B1 | 5/2001 | Ma et al. |

(Continued)

FOREIGN PATENT DOCUMENTS

| | | |
|---|---|---|
| CN | 1375869 | 10/2002 |
| CN | 1499595 | 5/2004 |

(Continued)

*Primary Examiner* — Marvin Payen
(74) *Attorney, Agent, or Firm* — Slater & Matsil, L.L.P.

(57) ABSTRACT

A conductive pillar for a semiconductor device is provided. The conductive pillar is formed such that a top surface is non-planar. In embodiments, the top surface may be concave, convex, or wave shaped. An optional capping layer may be formed over the conductive pillar to allow for a stronger inter-metallic compound (IMC) layer. The IMC layer is a layer formed between solder material and an underlying layer, such as the conductive pillar or the optional capping layer.

20 Claims, 8 Drawing Sheets

(56) References Cited

U.S. PATENT DOCUMENTS

| | | |
|---|---|---|
| 6,229,220 B1 | 5/2001 | Saitoh et al. |
| 6,232,243 B1 | 5/2001 | Farnworth et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,323,546 B2 | 11/2001 | Hsuan et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,454,159 B1 | 9/2002 | Takushima |
| 6,461,895 B1 | 10/2002 | Liang et al. |
| 6,562,653 B1 | 5/2003 | Ma et al. |
| 6,562,665 B1 | 5/2003 | Yu |
| 6,570,248 B1 | 5/2003 | Ahn et al. |
| 6,600,222 B1 | 7/2003 | Levardo |
| 6,600,234 B2 | 7/2003 | Kuwabara et al. |
| 6,607,938 B2 | 8/2003 | Kwon et al. |
| 6,661,085 B2 | 12/2003 | Kellar et al. |
| 6,717,245 B1 | 4/2004 | Kinsman et al. |
| 6,756,294 B1 | 6/2004 | Chen et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,906,418 B2 | 6/2005 | Hiatt et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,960,829 B2 | 11/2005 | Hogerl |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,129,575 B1 | 10/2006 | Lin et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,271,084 B2 | 9/2007 | Jeong et al. |
| 7,276,799 B2 | 10/2007 | Lee et al. |
| 7,279,795 B2 | 10/2007 | Periaman et al. |
| 7,285,867 B2 | 10/2007 | Matsuzaki et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,327,040 B2 | 2/2008 | Aoki et al. |
| 7,345,350 B2 | 3/2008 | Sinha |
| 7,370,411 B2 | 5/2008 | Yamano |
| 7,382,049 B2 | 6/2008 | Ho et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,482,703 B2 | 1/2009 | Hwang et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,619,306 B2 | 11/2009 | Kaneko |
| 7,820,543 B2 | 10/2010 | Chang et al. |
| 7,834,450 B2 | 11/2010 | Kang |
| 7,932,601 B2 | 4/2011 | Chang et al. |
| 8,299,616 B2 | 10/2012 | Chuang et al. |
| 8,318,596 B2 | 11/2012 | Kuo et al. |
| 8,546,945 B2 | 10/2013 | Kuo et al. |
| 2002/0132461 A1 | 9/2002 | Kizaki |
| 2003/0107137 A1 | 6/2003 | Stierman et al. |
| 2005/0026416 A1 | 2/2005 | Cheng et al. |
| 2005/0084989 A1 | 4/2005 | Wakabayashi et al. |
| 2006/0055032 A1 | 3/2006 | Chang et al. |
| 2006/0094224 A1 | 5/2006 | Huang et al. |
| 2006/0108685 A1 | 5/2006 | Tsou et al. |
| 2006/0113681 A1 | 6/2006 | Jeong et al. |
| 2006/0180887 A1 | 8/2006 | Ono |
| 2006/0207088 A1 | 9/2006 | Yamano |
| 2006/0211233 A1 | 9/2006 | Gan et al. |
| 2007/0029654 A1 | 2/2007 | Sunohara et al. |
| 2007/0032066 A1 | 2/2007 | Yamano |
| 2007/0059862 A1 | 3/2007 | Eng et al. |
| 2007/0123022 A1 | 5/2007 | Wakabayashi et al. |
| 2007/0145101 A1 | 6/2007 | Kataoka et al. |
| 2008/0093738 A1 | 4/2008 | Lin |
| 2008/0296764 A1 | 12/2008 | Chang et al. |
| 2009/0020869 A1 | 1/2009 | Xue et al. |
| 2009/0096092 A1 | 4/2009 | Patel |
| 2009/0108453 A1 | 4/2009 | Lin et al. |
| 2009/0130840 A1 | 5/2009 | Wang et al. |
| 2011/0057313 A1 | 3/2011 | Chang et al. |
| 2011/0186986 A1 | 8/2011 | Chuang et al. |
| 2011/0193220 A1 | 8/2011 | Kuo et al. |
| 2011/0227216 A1 | 9/2011 | Tseng et al. |
| 2012/0012997 A1 | 1/2012 | Shen et al. |
| 2013/0299984 A1 | 11/2013 | Wang et al. |

FOREIGN PATENT DOCUMENTS

| | | |
|---|---|---|
| CN | 1750257 | 3/2006 |
| JP | 2006287048 | 10/2006 |
| TW | 200524025 | 7/2005 |
| TW | 200820406 | 5/2008 |
| TW | 200832641 | 8/2008 |

US 8,921,222 B2

PILLAR STRUCTURE HAVING A NON-PLANAR SURFACE FOR SEMICONDUCTOR DEVICES

PRIORITY CLAIM AND CROSS-REFERENCE

This application is a continuation of U.S. patent application Ser. No. 13/933,940, titled. "Pillar Structure having a Non-Planar Surface for Semiconductor Devices" filed on Jul. 2, 2013 which is continuation of U.S. Pat. No. 8,546,945, titled "Pillar Structure having a Non-Planar Surface for Semiconductor Devices" issued on Oct. 1, 2013, which is a divisional of U.S. Pat. No. 8,318,596, titled "Pillar Structure having a Non-Planar Surface for Semiconductor Devices" issued on Nov. 27, 2012, which are hereby incorporated by reference.

BACKGROUND

This disclosure relates generally to semiconductor devices and more particularly, to pillar structures having a non-planar surface for semiconductor devices.

The past few decades have seen many shifts in electronics and semiconductor packaging that have impacted the entire semiconductor industry. The introduction of surface-mount technology (SMT) and ball grid array (BGA) packages were generally important steps for high-throughput assembly of a wide variety of integrated circuit (IC) devices, while at the same time allowing for reduction of the pad pitch on the printed circuit board. Conventionally packaged ICs have a structure basically interconnected by fine gold wire between metal pads on the die and electrodes spreading out of molded resin packages. Dual Inline Package (DIP) or Quad Flat Package (QFP) are fundamental structures of current IC packaging. However, increased pin count peripherally designed and arranged around the package typically results in too short of a pitch of lead wire, yielding limitations in board mounting of the packaged chip.

Chip-scale or chip-size packaging (CSP) and BGA packages are just some of the solutions that enable dense electrode arrangement without greatly increasing the package size. Some CSP techniques may provide the additional advantage of allowing for wafer packaging on a chip-size scale. CSP typically results in packages within 1.2 times the die size, which greatly reduces the potential size of devices made with the CSP material.

Some CSP or BGA packages rely on bumps of solder to provide an electrical connection between contacts on the die and contacts on a substrate, such as a packaging substrate, a printed circuit board (PCB), another die/wafer, or the like. Other CSP or BGA packages utilize a solder ball or bump placed onto a bump electrode or pillar, relying on the soldered joint for structural integrity. The different layers making up the interconnection typically have different coefficients of thermal expansion (CTEs). As a result, a relatively large stress derived from this difference is exhibited on the joint between the post and the bump electrode, which often causes cracks to form in the bonding area between the bump electrode/pillar and the solder ball or bump.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
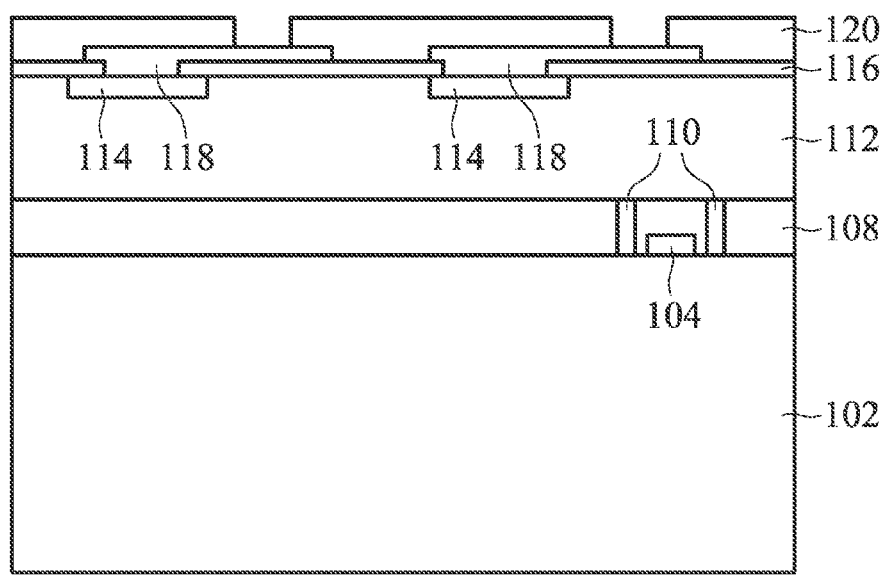
FIGS. 1-7 illustrate various intermediate stages of a method of forming semiconductor device having uneven pillars in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of a conductive pillar for use with semiconductor devices. As will be discussed below, embodiments are disclosed that utilize a conductive pillar for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board or packaging substrate, or the like. While embodiments may be utilized with any pillar size, it has been found that embodiments may be particularly useful for smaller pillar sizes, e.g., pillar sizes less than about 80 µm. Throughout the various views and illustrative embodiments, like reference numerals are used to designate like elements.

FIGS. 1-7 illustrate various intermediate stages of a method of forming a semiconductor device having uneven pillars in accordance with an embodiment. Referring first to FIG. 1, a portion of a substrate 102 having electrical circuitry 104 formed thereon is shown in accordance with an embodiment. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

Electrical circuitry 104 formed on the substrate 102 may be any type of circuitry suitable for a particular application. In an embodiment, the electrical circuitry 104 includes electrical devices formed on the substrate 102 with one or more dielectric layers overlying the electrical devices. Metal layers may be formed between dielectric layers to route electrical signals between the electrical devices. Electrical devices may also be formed in one or more dielectric layers.

For example, the electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 108. The ILD layer 108 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 108 may comprise a plurality of dielectric layers.

Contacts, such as contacts 110, are formed through the ILD layer 108 to provide an electrical contact to the electrical circuitry 104. The contacts 110 may be formed, for example, by using photolithography techniques to deposit and pattern a photoresist material on the ILD layer 108 to expose portions of the ILD layer 108 that are to become the contacts 110. An etch process, such as an anisotropic dry etch process, may be used to create openings in the ILD layer 108. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 110 as illustrated in FIG. 1.

One or more inter-metal dielectric (IMD) layers 112 and the associated metallization layers (not shown) are formed over the ILD layer 108. Generally, the one or more IMD layers 112 and the associated metallization layers are used to interconnect the electrical circuitry 104 to each other and to provide an external electrical connection. The IMD layers 112 may be formed of a low-K dielectric material, such as FSG formed by PECVD techniques or high-density plasma CVD (HDPCVD), or the like, and may include intermediate etch stop layers. Contacts 114 are provided in the uppermost IMD layer to provide external electrical connections.

It should also be noted that one or more etch stop layers (not shown) may be positioned between adjacent ones of the dielectric layers, e.g., the ILD layer 108 and the IMD layers 112. Generally, the etch stop layers provide a mechanism to stop an etching process when forming vias and/or contacts. The etch stop layers are formed of a dielectric material having a different etch selectivity from adjacent layers, e.g., the underlying semiconductor substrate 102, the overlying ILD layer 108, and the overlying IMD layers 112. In an embodiment, etch stop layers may be formed of SiN, SiCN, SiCO, CN, combinations thereof, or the like, deposited by CVD or PECVD techniques.

A protective layer 116, such as a dielectric material, may be formed and patterned over the surface of the uppermost IMD layer 112 to form an opening over the contacts 114 and to protect the underlying layers from various environmental contaminants. Thereafter, a conductive layer 118 is formed and patterned over the protective layer 116. The conductive layer 118 provides an electrical connection upon which contact bumps may be formed for external connections. The conductive layer 118 may also act as a redistribution layer (RDL) to provide a desired pin or ball layout. The conductive layer 118 may be formed of any suitable conductive materials, such as copper, tungsten, aluminum, silver, and combinations thereof, or the like.

A passivation layer 120, such as a dielectric layer, is formed and patterned over the conductive layer 118 as illustrated in FIG. 1. The passivation layer 120 may be formed of any suitable method, such as CVD, PVD, or the like. In an embodiment, the passivation layer 120 has a thickness of about 1.5 um to about 1.9 um.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

Figure 2:
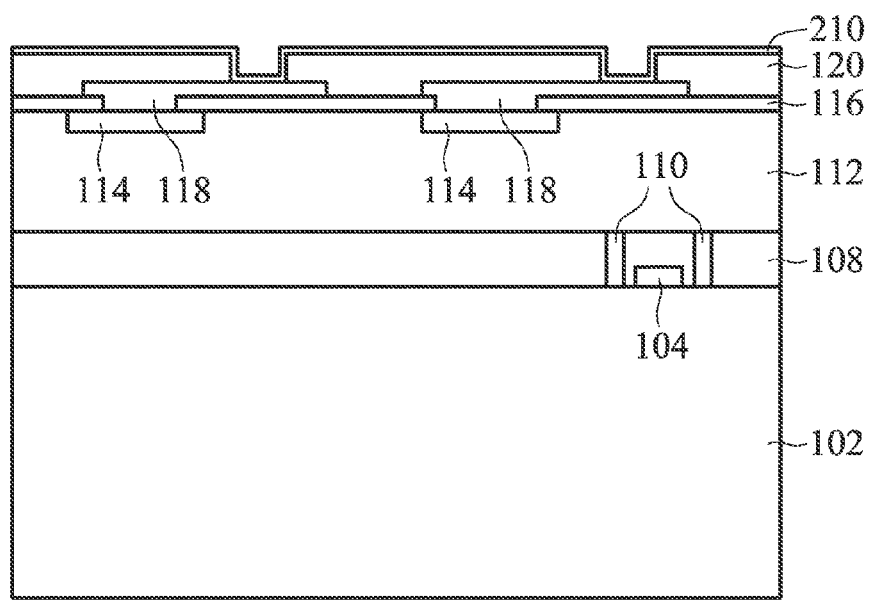

FIG. 2 illustrates a barrier layer 210 deposited over the surface of the passivation layer 120. The barrier layer 210 is a thin layer of a conductive material that aids in the formation of a thicker layer during subsequent processing steps. In an embodiment, the barrier layer 210 may be formed by depositing one or more thin conductive layers, such as one or more thin layers of Cu, Ti, Ta, TiN, TaN, combinations thereof, or the like, using CVD or physical vapor deposition (PVD) techniques. For example, in an embodiment a layer of Ti is deposited by a PVD process to form a diffusion barrier film and a layer of Cu is deposited by a PVD process to form a Cu seed layer. It should be noted that an optional polyimide layer (not shown) may be formed, for example, between the passivation layer 120 and the barrier layer 210.

Figure 3:
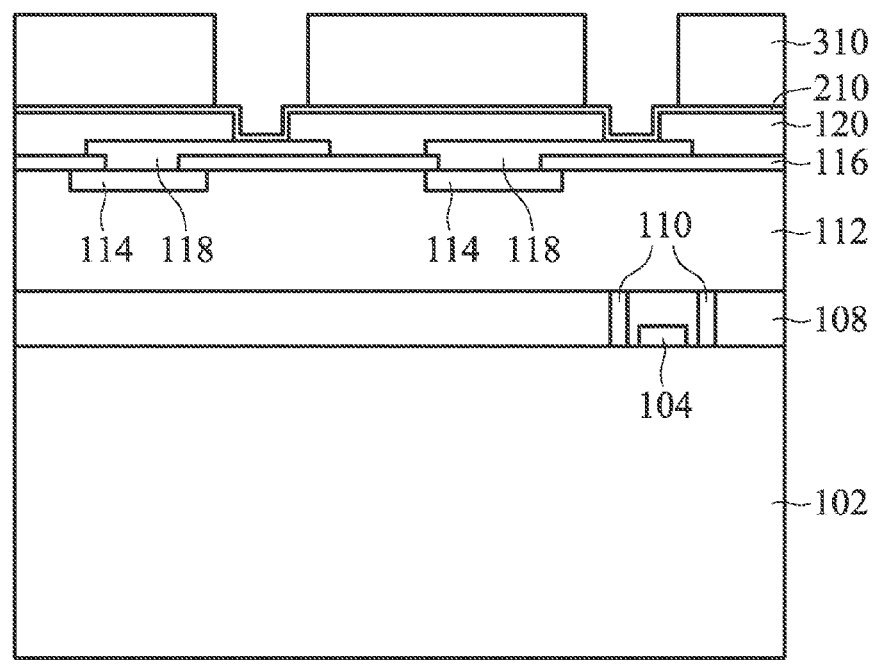

Thereafter, as illustrated in FIG. 3, a patterned mask 310 is formed over the seed layer 210 in accordance with an embodiment. The patterned mask 310 defines the lateral boundaries of the conductive pillar to be subsequently formed as discussed in greater detail below. The patterned mask 310 may be a patterned photoresist mask, hard mask, a combination thereof, or the like.

Figure 4:
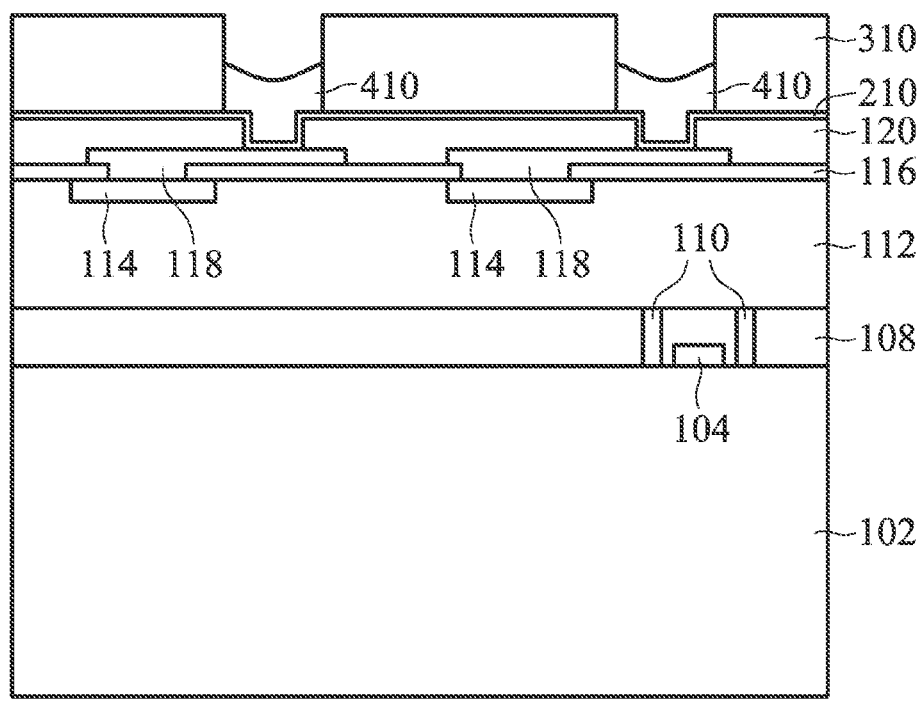

FIG. 4 illustrates the formation of a conductive pillar 410 in accordance with an embodiment. The conductive pillar 410 may be formed of any suitable conductive material, including Cu, Ni, Pt, Al, combinations thereof, or the like, and may be formed through any number of suitable techniques, including PVD, CVD, electrochemical deposition (ECD), molecular beam epitaxy (MBE), atomic layer deposition (ALD), electroplating, and the like. In an embodiment, the conductive pillar 410 has a thickness between about 30 μm and about 60 μm.

The conductive pillar 410 is formed by a process that results in an uneven surface, such as a concave surface as illustrated in FIG. 4. In an embodiment, the conductive pillar 410 is formed by an electroplating process wherein the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., exposed portions of the seed layer 210 within the openings of the patterned mask 310. The additives of the electroplating solution under which the electroplating process is performed may be adjusted to achieve an uneven surface. For example, to obtain the concave surface as illustrated in FIG. 4, the concentration of the leveler, which is one of the additives, may be reduced. The recipes of additives may vary for different solution vendors. Other processes, however, may be used.

Figure 5:
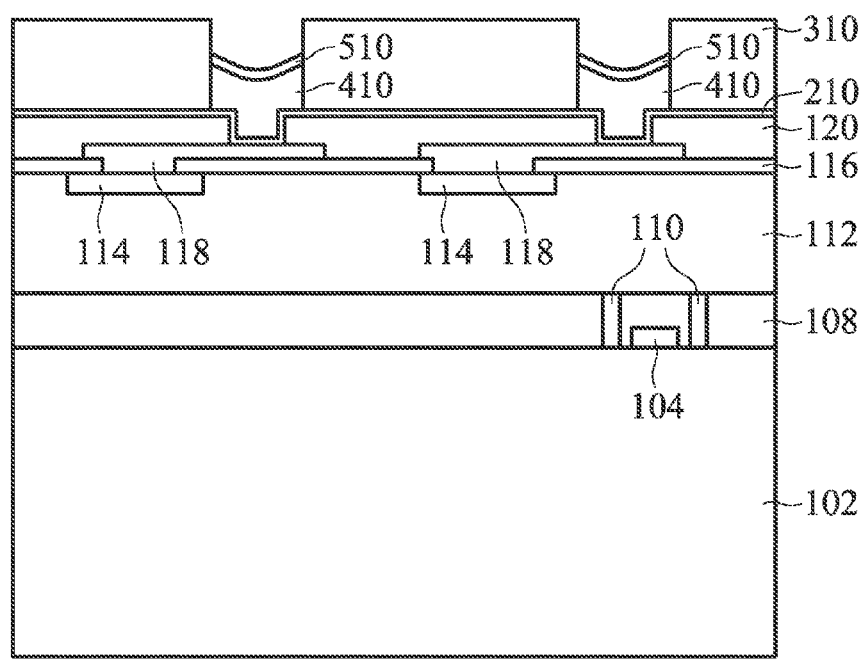

FIG. 5 illustrates formation of an optional conductive cap layer 510 formed over the conductive pillar 410. As described in greater detail below, solder material will be formed over the conductive pillar 410. During the soldering process, an intermetallic compound (IMC) layer is naturally formed at the joint between the solder material and the underlying surface.

It has been found that some materials may create a stronger, more durable IMC layer than others. As such, it may be desirable to form a cap layer, such as the conductive cap layer 510, to provide an IMC layer having more desirable characteristics. For example, in an embodiment in which the conductive pillar 410 is formed of copper, a conductive cap layer 510 formed of nickel may be desirable. Other materials, such as Pt, Au, Ag, combinations thereof, or the like, may also be used. The conductive cap layer 510 may be formed through any number of suitable techniques, including PVD, CVD, ECD, MBE, ALD, electroplating, and the like.

Figure 6:
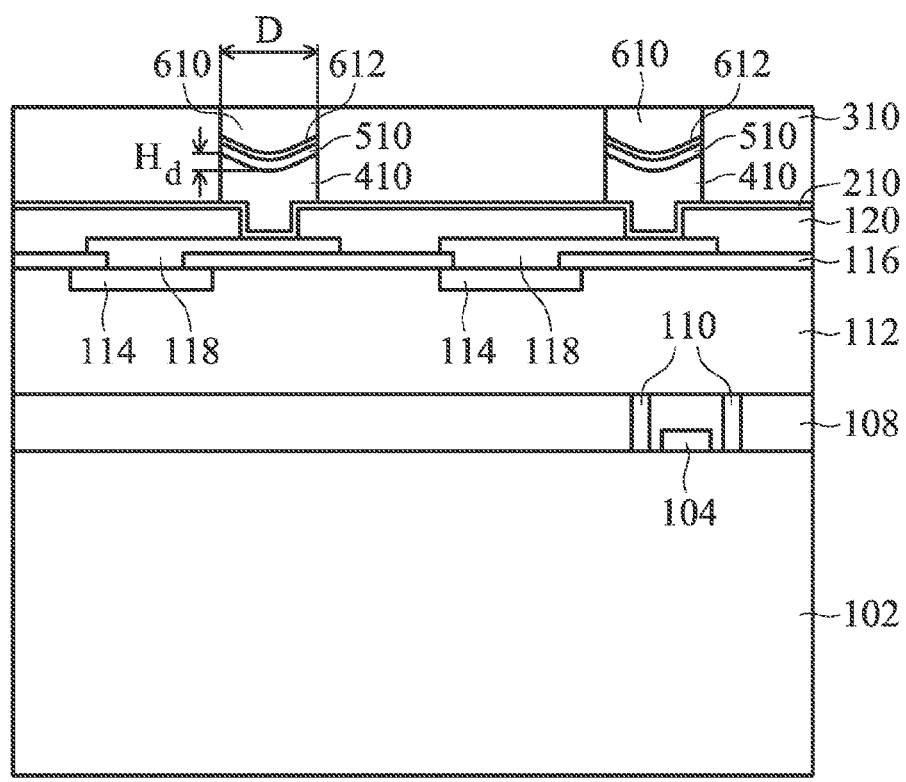

FIG. 6 illustrates formation of solder material 610 and an IMC layer 612. In an embodiment, the solder material 610 comprises SnPb, a high-Pb material, a Sn-based solder, a lead-free solder, or other suitable conductive material.

As one of ordinary skill in the art will appreciate, the conductive pillar 410 exhibits a rough, uneven surface. For example, as illustrated in FIG. 4, the conductive pillar 410 is formed in a manner such that the conductive pillar 410 exhibits a concave surface. In an embodiment, the surface roughness of the conductive pillar 410 is greater than about a thickness of the IMC layer 612. It has been found that such a structure as that described above reduces the cracking and/or the propagation of the cracks along the IMC layer 612. It is believed that the reduction in the crack propagation is due to the unevenness of a surface of the underlying conductive pillar 410, and it is further believed that the IMC layer 612 itself being uneven and having a thickness less than the amount of roughness of the pillar further impedes propagation of a crack. For example, it has been observed that in some embodiments the IMC layer 612 is less than about 6 μm. In these embodiments, it may be desirable to have a surface roughness of greater than 6 μm, and accordingly, in FIG. 6, the height $H_d$ is greater than about 6 μm. By having this amount of roughness it reduces the possibility of linear, or near linear, propagation of the cracks. In another embodiment, the height $H_d$ divided by the width D is greater than about 6%.

Additionally, in some embodiments, such as the concave surface such as that illustrated in FIGS. 4-6, the shape of the conductive pillar allows the conductive bump to better hold or restrict the solder to the end of the conductive pillar 410, thereby reducing the amount of solder wetting along sidewalls of the conductive pillar 410, which may result in a weaker IMC interface.

Figure 7:
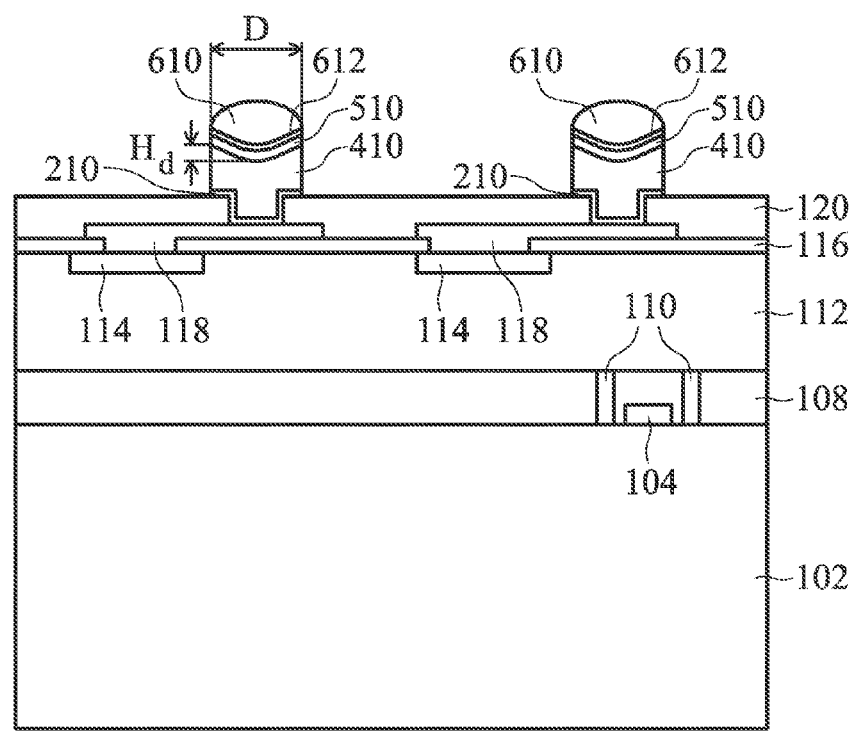

Thereafter, as illustrated in FIG. 7, the patterned mask 310 may be removed. In embodiments in which the patterned mask 310 is formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9), or another stripping process. A cleaning process, such as a wet dip in a chemical solution of phosphoric acid ($H_3PO_4$) and hydrogen peroxide ($H_2O_2$), referred to as DPP, with 1% hydrofluoric (HF) acid, or another cleaning process, may be performed to remove exposed portions of the seed layer 210 and any contaminants from the surface of the passivation layer 120.

Thereafter, a solder reflow process and other back-end-of-line (BEOL) processing techniques suitable for the particular application may be performed. For example, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

It should also be noted that other embodiments may not place the solder material on the conductive pillars 410 prior to attaching the substrate 102 to another substrate (not shown). In these other embodiments, the solder material may be placed on the other substrate and then the conductive pillars 410 on the substrate 102 are brought into contact with the solder material on the other substrate and a reflow process is performed to solder the two substrates together.

Figure 8A:
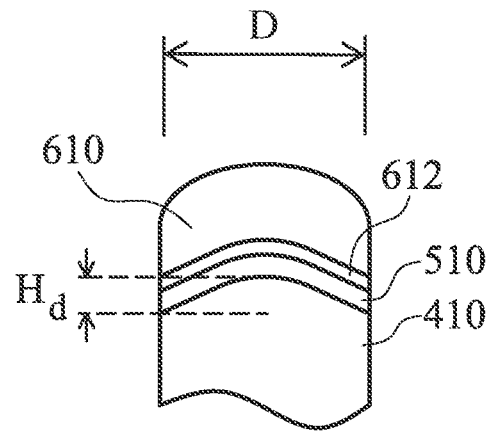
FIGS. 8a and 8b illustrate other shapes of pillars that may be used in accordance with other embodiments.
Figure 8B:
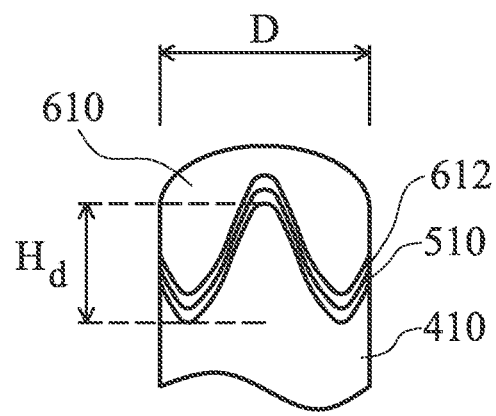

Additional surfaces that may be used for the conductive pillar are illustrated in FIGS. 8a and 8b. Referring first to FIG. 8a, a convex surface is created rather than the convex shape discussed above with reference to FIGS. 4-7. In this embodiment, the conductive pillar may be formed by, for example, increasing the concentration of the leveler, which is one of the electroplating solution additives. The recipes of additives may vary for different solution vendors. Other processes, however, may be used.

FIG. 8b illustrates an embodiment in which the surface of the conductive pillar 410 has a wave-type of surface. In this embodiment, the conductive pillar may be formed by, for example, increasing the current density during electroplating. Other processes, however, may be used.

A conductive pillar for a semiconductor device is provided. The conductive pillar is formed such that a top surface is non-planar. In embodiments, the top surface may be concave, convex, or wave shaped. An optional capping layer may be formed over the conductive pillar to allow for a stronger inter-metallic compound (IMC) layer. The IMC layer is a layer formed between a solder material and the underlying layer, such as the conductive pillar or the optional capping layer.

Other embodiments are disclosed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method, comprising:
   providing a substrate having a conductive layer;
   forming a conductive pillar over and in electrical contact with the conductive layer, the conductive pillar having a non-planar upper surface; and
   applying solder material over the pillar and in electrical contact with the conductive layer;
   wherein a distance between an uppermost point of the non-planar upper surface and a lowermost point of the non-planar upper surface is greater than about 6% of a width of the pillar.

2. The method of claim 1, wherein the non-planar upper surface is formed with a convex surface.

3. The method of claim 1, wherein the non-planar upper surface is formed with a concave surface.

4. The method of claim 1, wherein the non-planar upper surface is formed with a wave shape.

5. The method of claim 1, further comprising forming a capping layer over the pillar, and wherein the solder material is formed over the capping layer.

6. The method of claim 5, wherein the capping layer is formed of Ni, Pt, Au, or Ag.

7. The method of claim 6 wherein the capping layer is formed from a first material selected to form a first inter-metallic compound (IMC) resulting from the solder material and the first material that is stronger than a second IMC resulting from the solder material and a second material forming the pillar.

8. The method of claim 1, wherein the applying the solder material further comprises forming an inter-metallic compound (IMC) layer interposed between the pillar and the solder material, a thickness of the IMC layer being less than about the distance between the uppermost point of the non-planar upper surface and the lowermost point of the non-planar upper surface.

9. The method of claim 1, wherein a bottom surface of the solder material has a shape substantially corresponding to the non-planar upper surface of the pillar.

10. A method, comprising:
forming a conductive pillar of a first conductive material over and in electrical contact with a conductive layer, the conductive pillar having a non-planar upper surface; and
affixing a second conductive material different from the first conductive material over the non-planar upper surface of the conductive pillar, the second conductive material in electrical contact with the conductive layer;
wherein a distance between an uppermost point of the non-planar upper surface and a lowermost point of the non-planar upper surface is greater than about 6% of a width of the pillar.

11. The method of claim 10, wherein the second conductive material comprises a solder material.

12. The method of claim 10, further comprising forming a capping layer on the non-planar upper surface of the pillar, and wherein the second conductive material is affixed over the capping layer.

13. The method of claim 12, wherein the affixing the second conductive material further comprises forming an inter-metallic compound (IMC) layer interposed between the capping layer and the second conductive material.

14. The method of claim 13, wherein the capping layer is formed of Ni, Pt, Au, or Ag.

15. The method of claim 10, wherein the second conductive material has a bottom surface having a substantially same shape as the non-planar upper surface after the affixing the second conductive material.

16. The method of claim 15, wherein the second conductive material has an upper surface with a shape different from the non-planar upper surface after the affixing the second conductive material.

17. The method of claim 10, wherein the non-planar upper surface is formed having one of a convex shape and a concave shape.

18. A method of forming a structure, comprising:
forming a pillar of a first conductive material, the pillar having a non-planar upper surface; and
applying solder material over the pillar and in electrical contact with the pillar;
wherein a distance between an uppermost point of the non-planar upper surface and a lowermost point of the non-planar upper surface is greater than about 6 μm.

19. The method of claim 18, further comprising forming a capping layer over the pillar, wherein the applying the solder material forms an first inter-metallic compound (IMC) layer over the capping layer disposed between the solder material and the capping layer.

20. The method of claim 19 wherein the capping layer is formed from a second material selected to result in a first IMC stronger than a second IMC formed from the first conductive material forming the pillar.

* * * * *